United States Patent [19]

Humpleman

[11] Patent Number: 4,759,042

[45] Date of Patent: Jul. 19, 1988

[54] PARALLEL-TO-SERIAL CONVERTER

[75] Inventor: Richard J. Humpleman, Talke, Great Britain

[73] Assignee: Active Memory Technology Ltd., England

[21] Appl. No.: 23,416

[22] Filed: Mar. 9, 1987

[30] Foreign Application Priority Data

Mar. 8, 1986 [GB] United Kingdom ............... 8605757

[51] Int. Cl.⁴ .................... G11C 7/00; G11C 15/00
[52] U.S. Cl. .................................. 377/75; 377/54; 364/900
[58] Field of Search .................... 377/54, 64, 75; 364/900

[56] References Cited

U.S. PATENT DOCUMENTS

| | | | |
|---|---|---|---|
| 4,023,144 | 5/1977 | Koenig | 364/900 |
| 4,216,391 | 8/1980 | Gehrig et al. | 377/75 |
| 4,581,740 | 4/1986 | Kinoshita | 377/54 |
| 4,630,295 | 12/1986 | Kamuro et al. | 377/75 |

FOREIGN PATENT DOCUMENTS 0067384 12/1982 European Pat. Off. .
2119137 11/1983 United Kingdom .

Primary Examiner—John S. Heyman
Attorney, Agent, or Firm—Lyon & Lyon

[57] ABSTRACT

A parallel-to-serial converter is described, comprising a shift register into which a data word can be loaded in parallel and then shifted out serially. As the data is shifted out, a string of zeros is shifted in. When a predetermined number of zeros is detected, a flip-flop is set at the next clock beat. This switches the shift register into its parallel load mode so that, at the next again clock beat the shift register is parallel loaded with the next data word. The detection of the predetermined number of zeros and the setting up of the shift register occur in different clock periods, allowing the clock period to be reduced, thus increasing the speed of operation.

9 Claims, 2 Drawing Sheets

Fig.2.

| CLOCK BEAT | C($\bar{S}$) | D | B0 | B1 | B2 | B3 | B4 | B5 | B6 | B7 | |
|---|---|---|---|---|---|---|---|---|---|---|---|
|  | 0 | 1 | 1 | 1 | 1 | 1 | 1 | 1 | 1 | 1 | |
| 1 | 0 | 0 | 1 | 1 | 1 | 1 | 1 | 1 | 1 | 1 | |
| 2 | 0 | 0 | 0 | 1 | 1 | 1 | 1 | 1 | 1 | 1 | |
| 3 | 0 | 0 | 0 | 0 | 1 | 1 | 1 | 1 | 1 | 1 | |
| 4 | 0 | 0 | 0 | 0 | 0 | 1 | 1 | 1 | 1 | 1 | |
| 5 | 0 | 0 | 0 | 0 | 0 | 0 | 1 | 1 | 1 | 1 | |
| 6 | 0 | 0 | 0 | 0 | 0 | 0 | 0 | 1 | 1 | 1 | ← ZEROS DETECTED |
| 7 | 1 | 0 | 0 | 0 | 0 | 0 | 0 | 0 | 1 | 1 | |
| 8 | 0 | 1 | X | X | X | X | X | X | X | X | ← FIRST DATA WORD LOADED |
| 9 | 0 | 0 | 1 | X | X | X | X | X | X | X | |
| 10 | 0 | 0 | 0 | 1 | X | X | X | X | X | X | |
| 11 | 0 | 0 | 0 | 0 | 1 | X | X | X | X | X | |
| 12 | 0 | 0 | 0 | 0 | 0 | 1 | X | X | X | X | |
| 13 | 0 | 0 | 0 | 0 | 0 | 0 | 1 | X | X | X | |
| 14 | 0 | 0 | 0 | 0 | 0 | 0 | 0 | 1 | X | X | ← ZEROS DETECTED |
| 15 | 1 | 0 | 0 | 0 | 0 | 0 | 0 | 0 | 1 | X | |
| 16 | 0 | 1 | X | X | X | X | X | X | X | X | ← SECOND DATA WORD LOADED |
| 17 | 0 | 0 | 1 | X | X | X | X | X | X | X | |

PARALLEL-TO-SERIAL CONVERTER

This invention relates to parallel-to-serial converters. It is well known to use a shift register to convert data from parallel to serial form. Data is loaded into the shift register in a parallel load mode, and is then shifted out serially in a shift mode, in step with a clock signal. In one particular known form of parallel-to-serial converter, a logic circuit is provided for detecting that all the data has been shifted out of the register and that the next parallel load is required. When this condition is detected, the register is switched from its shift mode into its parallel load mode, so as to load the next parallel data into the register.

A problem with this arrangement is that shift registers generally have a long set-up time, i.e. the time required to switch from shift mode into parallel load mode and vice versa. This limits the maximum clock rate that can be used and hence slows down the operation of the converter.

The object of the present invention is to provide a parallel-to-serial converter with an enhanced operating speed.

SUMMARY OF THE INVENTION

According to the invention there is provided a parallel-to-serial converter comprising:
(a) a shift register into which data is loaded in parallel, in a parallel load mode, and then shifted out serially in a shift mode in step with a clock signal, and
(b) a logic circuit for detecting a condition indicating that the next parallel load is required and thereupon switching the shift register from its shift mode into its parallel load mode, characterized in that the logic circuit detects said condition in advance so that the detection of said condition and the switching of the shift register to its parallel load mode occur in different periods of said clock signal.

As will be shown, because the detection of the "parallel load required" condition and the setting of the shift register into its parallel load mode take place in different clock periods, the clock period can be shortened, i.e. a faster clock rate can be used, speeding up the operation of the converter.

BRIEF DESCRIPTION OF THE DRAWINGS

One parallel-to-serial converter in accordance with the invention will now be described by way of example with reference to the accompanying drawings.

FIG. 2 illustrates the operation of the converter.

DESCRIPTION OF AN EMBODIMENT OF THE INVENTION

Figure 1:
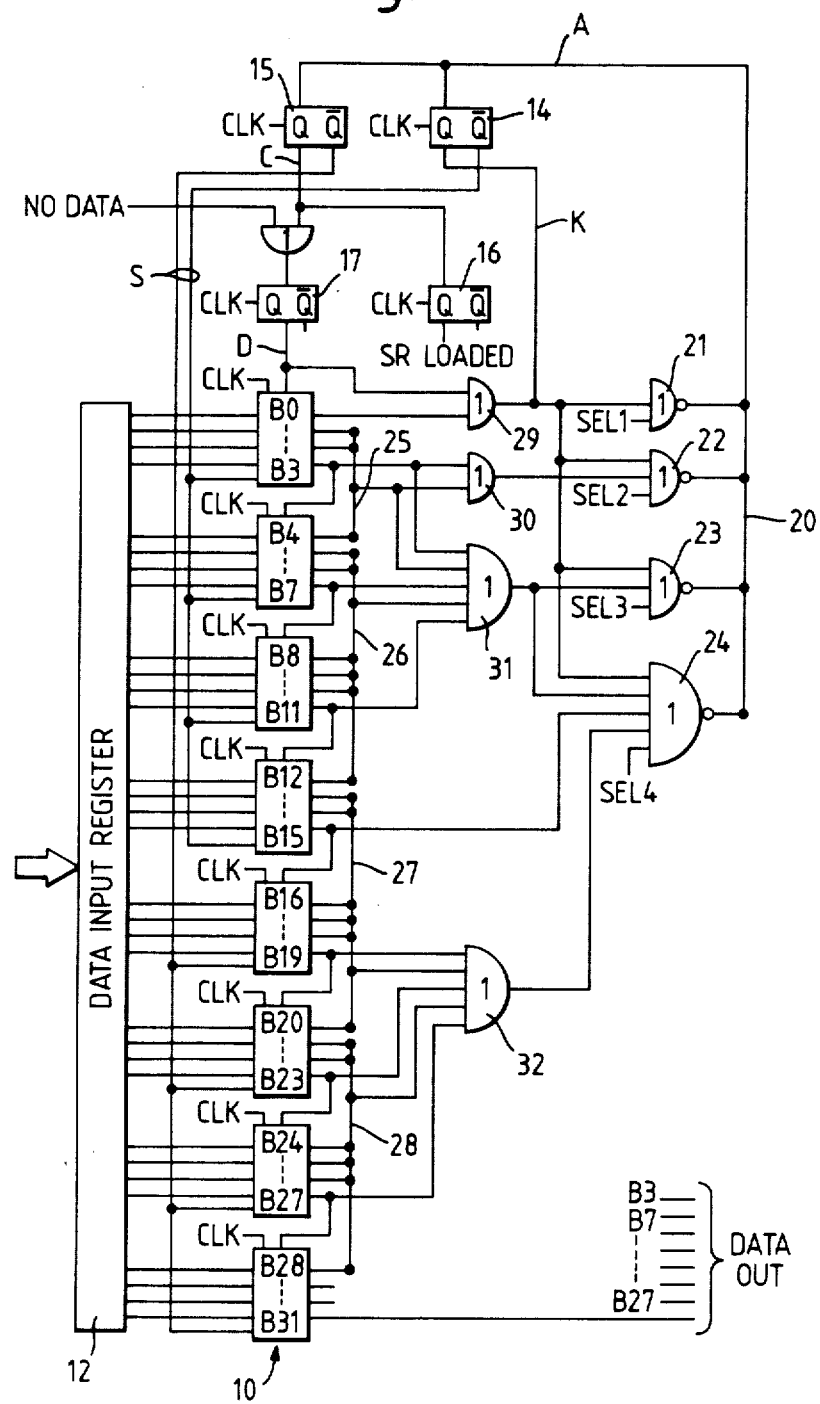
FIG. 1 is a circuit diagram of the converter.

Referring to FIG. 1, the parallel-to-serial converter comprises a shift register 10 containing 32 bits B0–B31. The register is constructed from eight 4-bit modules, connected in series. Each of these modules receives a clock signal CLK and a mode control signal S. When S is high (representing the bit "1"), the shift register is set into a shift mode in which its contents are shifted downwards (as viewed in the drawing) by one bit position at each beat of the clock CLK. When S is low (representing "o") the shift register is set into a parallel load mode in which it is loaded in parallel from a 32-bit data input register 12 at the next beat of clock CLK.

The converter is operable in four modes.

(a) In the first mode, the shift register 10 is loaded with a 32-bit data work every four clock beats, and this data is then shifted out eight bits at a time from the outputs of stages B3,B7,B11,B15,B19,B23,B27 and B31 of the shift register. This produces a 4:1 parallel-to-serial conversion.
(b) In the second mode, the register 10 is loaded with a 32-bit data word every eight clock beats, and this is shifted out four bits at a time from B7,B15,B23 and B31. This produces an 8:1 conversion.
(c) In the third mode, the register 10 is loaded with a 32-bit data word every sixteen beats, and this is shifted out two bits at a time from B15 and B31, to produce a 16:1 conversion.
(d) In the fourth mode, the register 10 is loaded with a 32-bit data word every 32 clock beats, and this is shifted out one bit at a time from B31, producing a 32:1 conversion.

The converter also includes four D-type flip-flops 14–17, all of which are clocked by the clock signal CLK. Flip-flops 14, 15 both receive a signal A at their data inputs. The Q output of flip-flop 15 is a signal C which is fed to the data input of flip-flop 16 and also, by way of an OR gate 18, to the data input of flip-flop 17. The OR gate 18 also receives a signal NODATA which indicates that there is no data present in the input register 12. The Q outputs of flip-flops 14,15 supply the signals S for controlling the mode of operation of the shift register 10. The Q output of flip-flop 17 is a signal D which supplies the serial data input to the first stage of the shift register.

The signal A is derived from a wired-OR connection of the outputs of four NOR gates 21–24. These gates are connected to respective OR networks, comprising wired-OR connections 25–28 and OR gates 29–32 as shown. The gates 21–24 also receive respective selection signals SEL1-SEL4 which determine the mode of operation of the converter as follows.

(a) In the first mode, SEL1 is low and SEL2–SEL4 are high. NOR gate 21 is therefore enabled, and the other NOR gates 22–24 are all disabled. The signal A is therefore equal to the NOR function of the input signal D and bit B0 of the shift register.
(b) In the second mode, SEL2 is low and the other selection signals are high. NOR gate 22 is enabled, and the signal A is therefore equal to the NOR function of D and B0–B4.
(c) In the third mode, SEL3 is low and the other selection signals are high. NOR gate 23 is enabled, and the signal A is therefore equal to the NOR function of D and B0–B12.
(d) In the fourth mode, SEL4 is low and the other selection signals are high. NOR gate 24 is enabled, and the signal A is therefore equal to the NOR function of D and B0–B28.

OPERATION

The operation of the circuit in the second mode (8:1 conversion) will now be described with reference to FIG. 2. In this mode, the NOR gate 22 is selected so that A equals the NOR of D, B0–B4.

It is assumed that initially no data is present in input register 12 and that NODATA is therefore high. Flip-flop 17 is therefore set, and D is high. Because D is high, the NOR gate 22 is disabled, making the signal A low. This clears the flip-flops 14 and 15. Thus, the signal S is high, putting the shift register 10 into its shift mode, so that it is shifted at each clock beat, causing a string of ones to be loaded serially into it from the signal D.

When the first parallel data word appears in register 12 (at clock beat 1 in FIG. 2) the signal NODATA goes low. A string of zeros is now loaded serially into the shift register from the signal D. This continues until the NOR gate 22 detects the all-zero condition of D and B0–B4 (at clock beat 6). This causes the signal A to go high, so that at the next clock beat (beat 7) the flip-flops 14 and 15 are set. This makes the signals S low, switching the shift register into its parallel load mode. At the same time, the signal C goes high. Also, the Q output of flip-flop 14 produces a signal K which is fed to the inputs of the NOR gates 21–24, to disable all these gates. This forces the signal A low, preventing a spurious repetition of this signal for a second clock beat.

Since the shift register is now in its parallel load mode, it is loaded in parallel with data from the input register 12 at the next clock beat (beat 8), as indicated by XXX ... X in FIG. 2. At the same time, the signal C sets the flip-flop 16 to indicate that the shift register has been loaded. Signal C also sets flip-flop 17 making D high. Since A has been forced low, the flip-flops 14,15 are both cleared. Signal S therefore goes high again, putting the shift register back into the shift mode.

At the next clock beat (beat 9) the register starts shifting again, causing the data to be shifted out, four bits at a time, from the outputs of bits B7, B15, B23 and B31. At the same time a one followed by a string of zeros is shifted into the register from the signal D.

At beat 14, the NOR gate 22 once again detects the all-zero condition of D and B0–B4, making A high. Thus, the flip-flops 14,15 are set again at beat 15 and the shift register is loaded at beat 16, in the same way as before.

This cycle continues for successive data words. It can be seen that a new data word is loaded every eight clock beats, and is then shifted out four bits at a time, providing the required 8:1 conversion.

The operation in the other three modes is similar, and need not be described.

CLOCK RATE

The maximum rate of the clock CLK can be calculated as follows. The timing figures quoted are by way of example only, and are typical for ECL logic devices.

In the clock period during which the all-zero condition is detected (i.e. the period between beats 6 and 7 in FIG. 2) the following delays occur:

| clock-to-output delay of shift register | 2.1 |
|---|---|
| delay through OR gates | 1.1 |
| delay through NOR gates | 1.1 |
| Set-up time of flip-flops 14,15 | 0.7 |
| TOTAL (nanoseconds) | 5.0 |

In the next clock period, during which the shift register is set into its parallel load mode, the following delays occur:

| clock-to-output delay of flip-flops | 2.1 |
|---|---|
| set-up time of shift register | 3.0 |
| TOTAL (nanoseconds) | 5.1 |

It can be seen that the latter timing path is the critical one for determining the clock rate. The maximum allowable clock rate is therefore 196 MHz, corresponding to a clock period of 5.1 nanoseconds.

By way of comparison, suppose that the circuit described above was modified by re-connecting the OR gates so that they detected the all-zero condition one step further down the register. In this case, signal A would indicate that the next data word is to be loaded at the next clock beat, as in a prior art converter circuit, rather than at the next-but-one clock beat. Signal A would therefore be used to directly control the shift register mode control lines S, rather than being buffered for one clock beat in flip-flops 14,15.

In this modified arrangement, the following delays would all occur in the clock period during which the all-zero condition is detected:

| clock-to-output delay of shift register | 2.1 |
|---|---|
| delay through OR gates | 1.1 |
| delay through NOR gates | 1.1 |
| set-up time of shift register | 3.0 |
| TOTAL (nanoseconds) | 7.3 |

Thus, the clock rate would have to be reduced to 137 MHz to allow for these delays. In other words, in this example, the invention increases the maximum clock rate from 137 to 196 MHz. The reason for this improved performance is that, in the invention, the delay due to detection of the all-zero condition occurs in a different clock period to the set-up delay of the shift register.

What is claimed is:

1. A parallel-to-serial converter comprising:
   (a) a shift register having a parallel load mode in which data is loaded into the shift register in parallel, and a serial shift mode in which data is shifted out of the shift register serially,
   (b) means for applying a clock signal to the shift register to control shifting of the data in the serial shift mode, the clock signal consisting of a sequence of clock cycles,
   (c) detection means, connected to the shift register, for detecting, in a first clock cycle, that a next parallel load is required at least two clock cycles ahead, and
   (d) load control means, responsive to said detection means, and operative in a second clock cycle following said first clock cycle, for switching the shift register into its parallel load mode.

2. A parallel-to-serial converter according to claim 1 wherein the load control means comprises a data storage device, means responsive to said detection means for setting the data storage device, and means responsive to the data storage device when set, to produce a mode control signal for switching the shift register into its parallel load mode.

3. A parallel-to-serial converter according to claim 2 wherein the data storage device, when set, also produces an inhibit signal for disabling said detection means during said second clock cycle, thereby preventing a spurious output from said detection means.

4. A parallel-to-serial converter comprising:
   (a) a shift register having a parallel load mode in which data is loaded into the shift register in parallel, and a serial shift mode in which data is shifted out of the shift register serially,
   (b) means for applying a clock signal to the shift register to control shifting of the data in the serial shift mode, the clock signal consisting of a sequence of clock cycles,
(c) means connected to the shift register for shifting into the shift register a sequence of bits of a predetermined value simultaneously with shifting out of the data in the serial shift mode,
(d) detection means, connected to the shift register, for detecting, in a first clock cycle, a predetermined number of said bits of predetermined value in the shift register, and
(e) load control means, responsive to said detection means, and operative in a second clock cycle following said first clock cycle, for switching the shift register into its parallel load mode.

5. A parallel-to-serial converter according to claim 4 wherein the load control means comprises a data storage device, means responsive to said detection means for setting the data storage device, and means responsive to the data storage device when set, to produce a mode control signal for switching the shift register into its parallel load mode.

6. A parallel-to-serial converter according to claim 5 wherein the data storage device, when set, also produces an inhibit signal for disabling said detection means during said second clock cycle, thereby preventing a spurious output from said detection means.

7. A parallel-to-serial converter comprising:
(a) a shift register having a parallel load mode in which data is loaded into the shift register in parallel, and a serial shift mode in which data is shifted out of the shift register serially,
(b) means for applying a clock signal to the shift register to control shifting of the data in the serial shift mode, the clock signal consisting of a sequence of clock cycles,
(c) means connected to the shift register for shifting into the shift register a sequence of bits of a predetermined value simultaneously with shifting out of the data in the serial shift mode,
(d) a plurality of detection means, each detection means being connected to the shift register for detecting, in a first clock cycle, a respective predetermined number of said bits of predetermined value in the shift register,
(e) means for selecting one of the selection means, and
(f) load control means responsive to the selected one of the detection means, and operative in a second clock cycle following said first clock cycle for switching the shift register into its parallel load mode.

8. A parallel-to-serial converter according to claim 7 wherein the load control means comprises a data storage device, means responsive to said selected one of the detection means for setting the data storage device, and means responsive to the data storage device when set, to produce a mode control signal, for switching the shift register into its parallel load mode.

9. A parallel-to-serial converter according to claim 8 wherein the data storage device, when set, produces an inhibit signal for disabling all said detection means during said second clock cycle, thereby preventing a spurious output from said detection means.

* * * * *